(12) United States Patent
McElroy (10) Patent No.: US 6,240,003 B1
(45) Date of Patent: May 29, 2001

(54) DRAM CONTENT ADDRESSABLE MEMORY USING PART OF THE CONTENT AS AN ADDRESS

(75) Inventor: David J. McElroy, Livingston, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/562,192

(22) Filed: May 1, 2000

(51) Int. Cl.$^7$ ................................................. G11C 15/00
(52) U.S. Cl. ............................................ 365/49; 365/189.04
(58) Field of Search ................................. 365/189.04, 49

(56) References Cited

U.S. PATENT DOCUMENTS

| | | | |
|---|---|---|---|
| 4,622,653 | 11/1986 | McElroy | 365/49 |
| 4,791,606 | 12/1988 | Threewitt et al. | 365/49 |
| 5,042,011 | 8/1991 | Casper et al. | 365/205 |
| 5,226,009 | * 7/1993 | Arimoto | 365/189.04 |
| 5,280,205 | 1/1994 | Green et al. | 307/530 |
| 5,450,351 | 9/1995 | Heddes | 365/49 |
| 5,568,415 | 10/1996 | McLellan et al. | 365/49 |
| 5,627,785 | 5/1997 | Gilliam et al. | 365/189.01 |
| 5,642,322 | 6/1997 | Yoneda | 365/230.03 |
| 5,949,696 | 9/1999 | Threewitt | 365/49 |
| 5,978,246 | 11/1999 | Shindo | 365/49 |
| 5,995,401 | 11/1999 | Schultz et al. | 365/49 |
| 5,999,434 | 12/1999 | Yoneda et al. | 365/49 |
| 5,999,435 | 12/1999 | Henderson et al. | 365/49 |
| 6,009,504 | 12/1999 | Krick | 711/220 |

OTHER PUBLICATIONS

Loring Wirbel, "MOSAID Preps Family of DRAM–Based CAMs," Semiconductors, Electronic Engineering Times, Sep. 27, 1999, pp. 49 and 58.

\* cited by examiner

*Primary Examiner*—David Nelms
*Assistant Examiner*—M. Tran
(74) *Attorney, Agent, or Firm*—Dickstein Shapiro Morin & Oshinsky LLP (57) ABSTRACT

A CAM device that utilizes a portion of a desired content as a row address is provided. A row in a CAM memory array is accessed using the row address portion of the desired content. The remaining portion of the desired content is used as a key data tag for comparison with content stored within memory locations of the addressed row. This way, the CAM device does not have to sequentially access each row in the memory array to locate memory cells having the desired content. The CAM can comprise a standard DRAM memory array, sense amplifiers and compare logic located in the sense amplifiers. Alternatively, the CAM device can comprise a standard SRAM memory array and associated compare logic. By accessing the CAM device using a portion of the desired content as a row address, the CAM device can perform a high speed search while also reducing the complexity of the CAM circuitry.

41 Claims, 7 Drawing Sheets

DRAM CONTENT ADDRESSABLE MEMORY USING PART OF THE CONTENT AS AN ADDRESS

BACKGROUND OF THE INVENTION

1. Field of the Invention

The present invention relates to the field of semiconductor memory devices and, more particularly to a content addressable memory (CAM) device utilizing part of the search content as an address.

2. Description of the Related Art

Content addressable memory (CAM) devices are becoming more important in today's highly technical society. CAM devices are frequently employed in network equipment, particularly routers and switches, computer systems and other devices that require content searching. CAM devices are sometimes referred to as associative memories.

A CAM device does not operate like a random access memory (RAM) device. In a RAM device, an address is provided by a controller, the address is used to access a particular memory location within the RAM memory array and then the content stored in the addressed memory location is retrieved from the memory array. A CAM device, on the other hand, is interrogated by a desired content. That is, in a CAM device, "key data" corresponding to the desired content is generated and used to search the memory locations of the entire CAM memory array. When the content stored in the CAM memory array does not match the key data, the CAM device returns a no match indication. When the content stored in the CAM memory array matches the key data, the CAM device outputs information associated with the content.

In network router or switch, for example, CAM devices are used to store Internet Protocol (IP) addresses and routing instructions associated with each address. When an IP packet is received and the IP address obtained, the router must retrieve the routing information for the packet in order to send it on the most direct route to the desired IP address. By using a CAM memory device, the router can search the CAM for the desired IP address (i.e., the desired content). If there is a match, the CAM returns the associated routing information.

Traditional CAM devices have been implemented using SRAM memory cells. However, with this structure, each CAM cell uses a large number of transistors so that all of the cells in the array may be read at once. Alternative CAM devices are being made from other RAM memory cells. Unfortunately, these devices require the rows of the CAM device to be read sequentially one row at a time and is prohibitively slow.

Accordingly, there is a desire and need for a CAM device with minimized cell structure and high speed searching capabilities.

SUMMARY OF THE INVENTION

The present invention provides a content addressable memory (CAM) device with minimized cell structure and high speed searching capabilities.

The above and other features and advantages of the invention are achieved by providing a CAM device that utilizes a portion of a desired content as a row address. A row in a CAM memory array is accessed using the row address portion of the desired content. The remaining portion of the desired content is used as a key data tag for comparison with content stored within memory locations of the addressed row. This way, the CAM device does not have to sequentially access each row in the memory array to locate memory cells having the desired content. The CAM can comprise a standard DRAM memory array, sense amplifiers and compare logic located in the sense amplifiers. Alternatively, the CAM device can comprise a standard SRAM memory array and associated compare logic. By accessing the CAM device using a portion of the desired content as a row address, the CAM device can perform a high speed search while also reducing the complexity of the CAM circuitry.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF PREFERRED EMBODIMENTS

Figure 1:
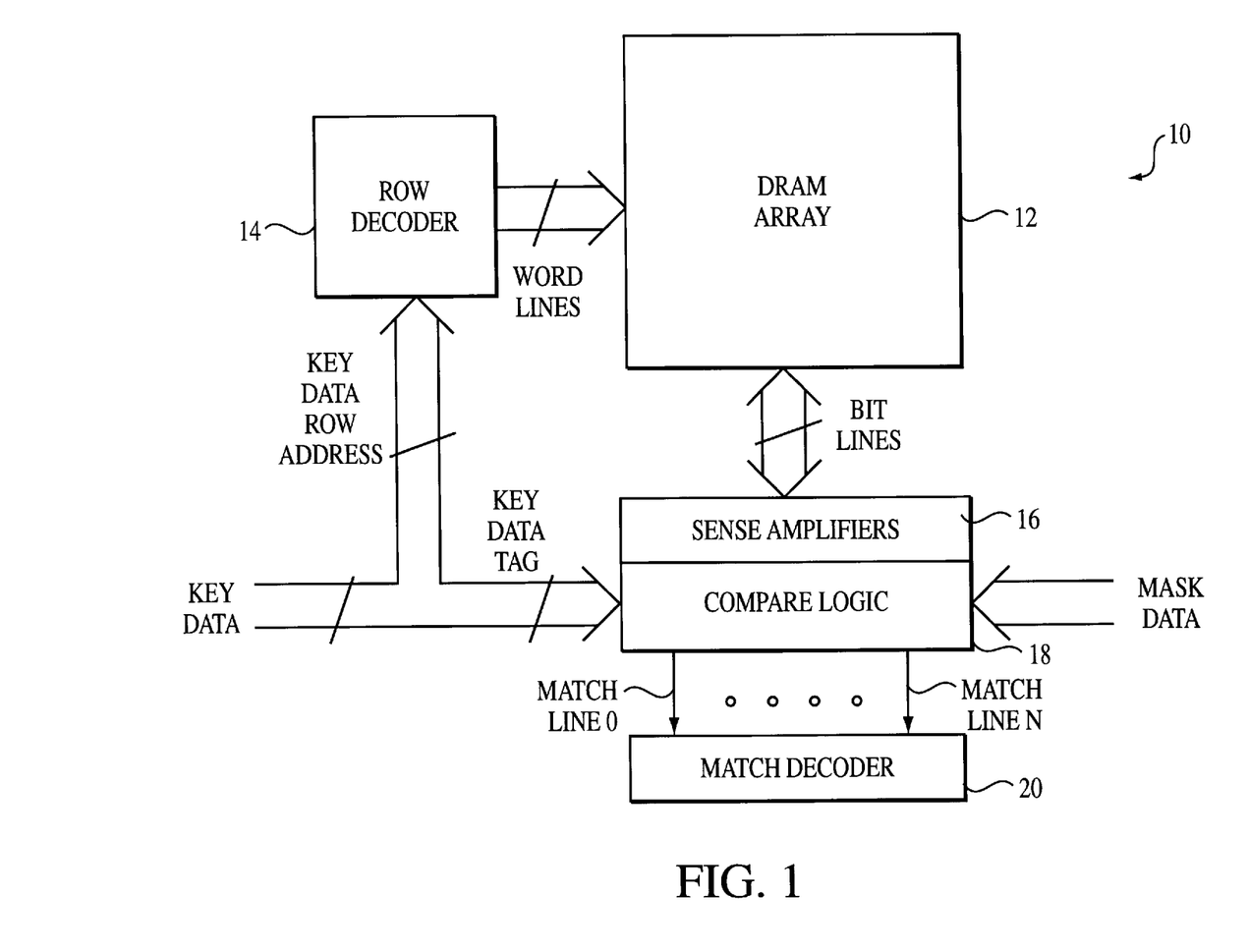
FIG. 1 is a block diagram illustrating a CAM device constructed in accordance with one embodiment of the present invention.

FIG. 1 illustrates a CAM device 10 constructed in accordance with one embodiment of the present invention. The device 10 includes a memory array 12, row decoder 14, sense amplifier circuitry 16, compare logic 18 and a match decoder 20. Inputs to the CAM device 10 include "key data" representing a desired content to be located within the CAM 10 and "mask data" representing bits of the desired content that are not pertinent for the current search (i.e., mask data is used to mask out data bits that are considered "don't cares"). As will be discussed below, the present invention utilizes a portion of the key data as a row address to speed up the search for the desired content. The remaining portion of the key data that is not used as the row address is referred to as the "tag." The tag portion of the key data will be compared to the contents of the memory array 12 to complete the search for the desired content.

The memory array 12 is comprised of an array of dynamic random access memory (DRAM) cells with each cell consisting of a storage capacitor and an access transistor (not shown). The memory cells of the array 12 are organized into a plurality of rows, with each row having memory cells grouped into a plurality of words. It is desirable for words to be 32-bit words, although the words can be 8-bit, 16-bit, 64-bit, or any other size suitable for the intended application. Word lines used to activate rows within the memory array 12 connect the array 12 to the row decoder 14. The bit lines from the memory cells are connected to the sense amplifier circuitry 16.

Although illustrated as a separate component, the compare logic 18 is preferably located within the sense amplifier circuitry 16. As will be described below, the compare logic 18 is responsible for comparing the tag portion of the key data to information retrieved from an addressed row of the memory array 12. The compare logic 18 will also utilize the mask data to mask out "don't cares" bits for a particular comparison. It should be noted that the compare logic 18 is only required for the portions of the memory array 12 that are to be used as a CAM. That is, because the memory array 12 is comprised of conventional DRAM memory cells, portions of the array 12 may be used as DRAM and other portions may be used as CAM (if desired). The DRAM portions could be used to store the information associated with the content stored in the CAM cells—thus, alleviating the need for an additional memory array to store the associated information (e.g., routing information).

Figure 2:
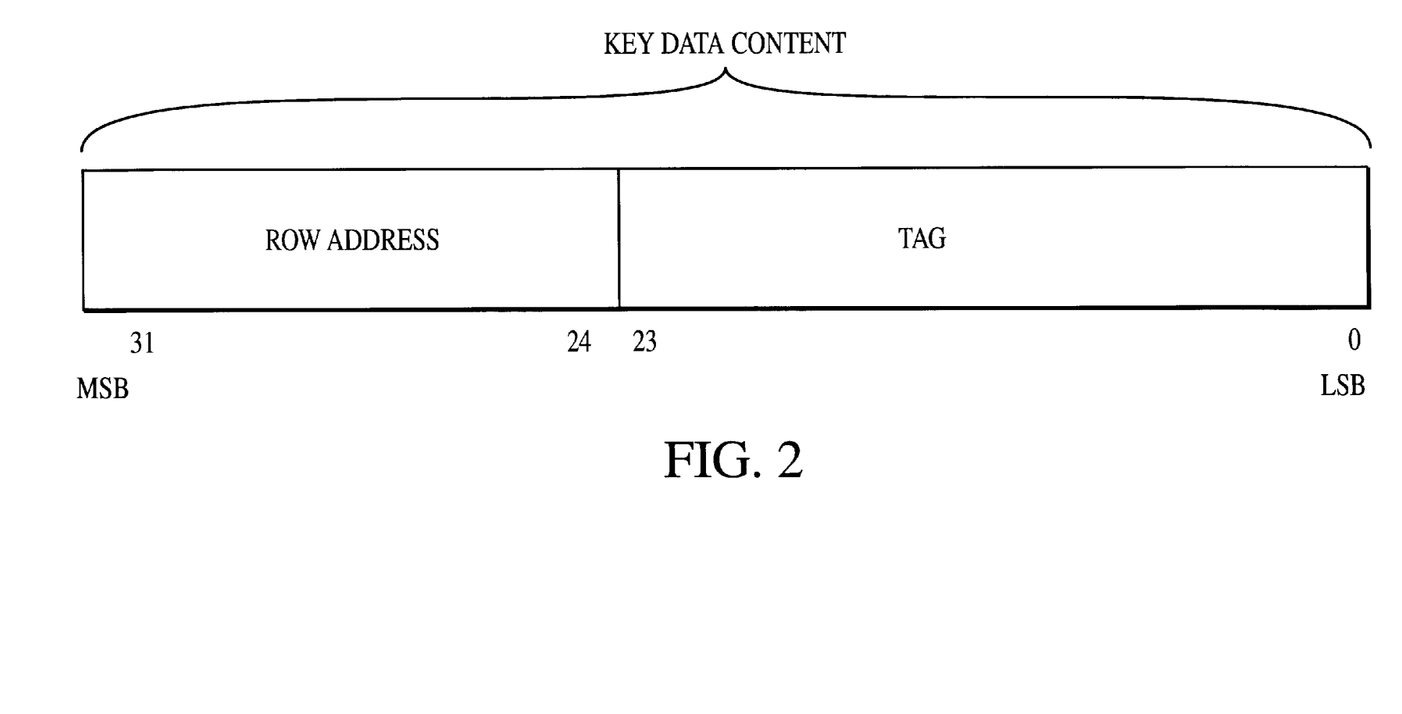
FIG. 2 illustrates exemplary key data utilized by a CAM device constructed in accordance with the present invention.

In addition to the use of DRAM cells and sense amplifier circuitry 16 having compare logic 18, the present invention utilizes a portion of the key data as a row address and the remaining portion as the tag to be located within the addressed rows of the memory array 12. FIG. 2 illustrates exemplary key data utilized by the CAM device 10 (illustrated in FIG. 1). In this example, the 8 most significant bits (MSBs) of the key data are used as the row address portion, while the remaining 24 least significant bits (LSBs) are used as the tag portion. It should be noted that the row address portion could be comprised of any number of bits and is not limited to 8-bits. Moreover, it should be appreciated that the row address portion could be comprised of LSBs instead of MSBs if so desired. If the CAM device 10 were used in a network switch or router, the key data content would be an IP address. A portion of the address, e.g., the 10 MSBs, would be used as a row address and the remaining bits of the address would be used as the tag. As noted above, the associated data would most likely be routing information for that IP address.

It should be noted that the row address can be computed from the desired content (or key data) in any manner and should not be limited to a grouping of bits (or portions) as illustrated in FIG. 2. That is, the row address could comprise a scrambled order of the bits in the key data, or a non linear transformation of the bits (e.g., encrypted bits), etc.

Referring again to FIG. 1, the row address portion of the key data is sent to the row decoder 14 while the tag portion is sent to the compare logic 18. The entire key data content can be sent to the row decoder 14 and the compare logic 18 if desired. In that case, the row decoder 14 and compare logic 18 would require a mechanism for masking out the unwanted portions of the key data. Once the row decoder 14 receives the row address, a word line corresponding to the row address is activated. The activation of the word line couples all of the memory cells corresponding to that row to respective bit lines, which are then input into the sense amplifier circuitry 16. It is desired that all of the words in the activated row be sent to the sense amplifier circuitry 16, which has individual groups of sense amplifiers for each word.

The sense amplifier circuitry 16 contains individual sense amplifiers for detecting and amplifying the data being transferred from the storage capacitors to the bit lines by measuring the potential difference between the activated bit time and a reference line which may be an inactive bit line. The operation of DRAM sense amplifiers is described, for example, in U.S. Pat. Nos. 5,627,785; 5,280,205; and 5,042,011, all assigned to Micron Technology Inc., and incorporated by reference herein.

The compare circuitry 18 inputs the information from the sense amplifiers and compares the information to the tag portion of the key data. Any information that is considered a don't care is masked out by the compare logic 18 (via the mask data). As noted above, all of the words in an activated row are sent to the sense amplifier circuitry 16 at the same time thus, the compare logic 18 can compare the key data tag to each word at the same time also. The compare logic outputs match signal lines to the match decoder 20. FIG. 1 illustrates a plurality of match signal lines. It is desired that there be a match signal line for every word in a row. Thus, if it is possible for a row to contain sixteen words, then the compare logic 18 will execute sixteen simultaneous comparisons and output sixteen match signal lines to indicate the results of the comparisons.

Figure 4:
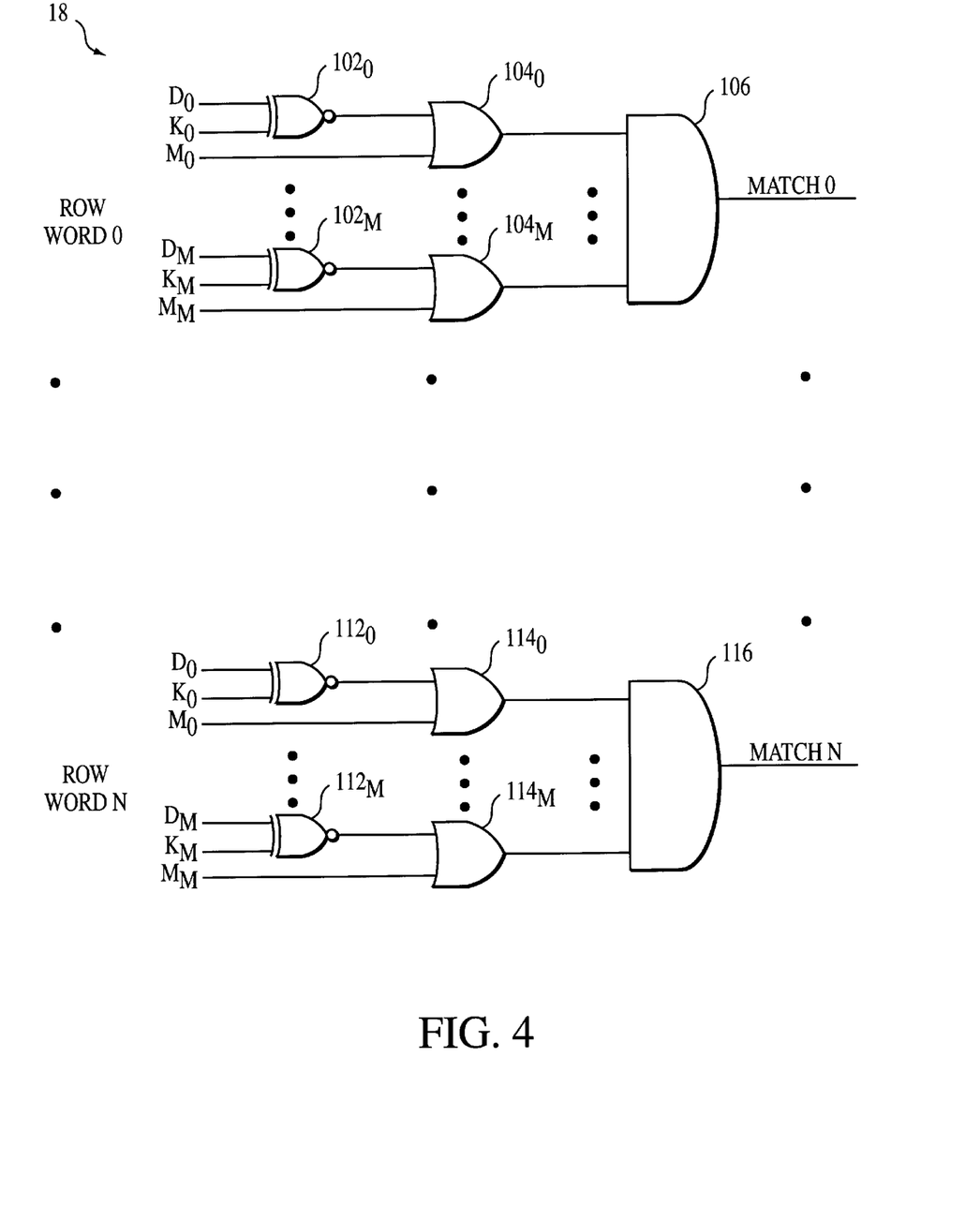
FIG. 4 illustrates an exemplary compare logic circuit utilized by a CAM device constructed in accordance with the present invention.

FIG. 4 illustrates an exemplary compare logic circuit 18 utilized by the present invention. The circuit 18 inputs bit line data $D_0$ to $D_M$ for each word in a row ROW WORD 0 to ROW WORD N. The circuit also inputs key data tag bits $K_0$ to $K_M$ and mask data bits $M_0$ to $M_M$. With respect to the first row of information ROW WORD 0, the bit line data $D_0$ to $D_M$ and the key data tag bits $K_0$ to $K_M$ are input in respective exclusive NOR gates $102_0$ to $102_M$. The outputs of the exclusive NOR gates $102_0$ to $102_M$ are sent to an input of respective OR gates $104_0$ to $104_M$. The mask data bits $M_0$ to $M_M$ are also input to respective OR gates $104_0$ to $104_M$. The outputs of the OR gates $104_0$ to $104_M$ are sent to the inputs of an AND gate 106. The output of the AND gate 106 is used as the match signal line MATCH 0 for the first row word.

With respect to the last row of information ROW WORD N, the bit line data $D_0$ to $D_M$ and the key data tag bits $K_0$ to $K_M$ are input in respective exclusive NOR gates $112_0$ to $112_M$. The outputs of the exclusive NOR gates $112_0$ to $112_M$ are sent to an input of respective OR gates $114_0$ to $114_M$. The mask data bits $M_O$ to $M_M$ are also input to respective OR gates $114_0$ to $114_M$. The outputs of the OR gates $114_0$ to $114_M$ are sent to the inputs of an AND gate 116. The output of the AND gate 116 is used as the match signal line MATCH N for the last row word.

As can be seen, if all of the bit line data $D_0$ to $D_M$ and the key data tag bits $K_0$ to $K_M$ of ROW WORD 0 match, the outputs of the exclusive NOR gates $102_0$ to $102_M$ will go to logic "1." This logic "1" output is sent to the OR gates $104_0$ to $104_M$, causing the OR gates $104_0$ to $104_M$ to have a logic "1" output regardless of the values of the mask data bits $M_0$ to $M_M$. If, any of the mask data bits $M_0$ to $M_M$ are set to a logic "1" value, then the respective OR gates $104_0$ to $104_M$ are set to a logic "1" even if the respective bit line data $D_0$ to $D_M$ and the key data tag bits $K_0$ to $K_M$ do not match. If all of the OR gates $104_0$ to $104_M$ have a logic "1" output, then the AND gate 106 has a logic "1" output MATCH 0. A logic "1" output indicates a match.

If the bit line data $D_0$ to $D_M$ and the key data tag bits $K_0$ to $K_M$ do not match, the outputs of the exclusive NOR gates $102_0$ to $102_M$ are set to logic "0." This logic "0" output is sent to the OR gates $104_0$ to $104_M$, causing the OR gates $104_0$ to $104_M$ to have a logic "0" output unless some of the values of the mask data bits $M_0$ to $M_M$ are set to logic "1." If any of the OR gates $104_0$ to $104_M$ have a logic "0" output, then the AND gate 106 has a logic "0" output MATCH 0. A logic "0" output indicates no match.

If all of the bit line data $D_0$ to $D_M$ and the key data tag bits $K_0$ to $K_M$ of ROW WORD N match, the outputs of the exclusive NOR gates $112_0$ to $112_M$ will go to logic "1." This logic "1" output is sent to the OR gates $114_0$ to $114_M$, causing the OR gates $114_0$ to $114_M$ to have a logic "1" output regardless of the values of the mask data bits $M_0$ to $M_M$. If, any of the mask data bits $M_0$ to $M_M$ are set to a logic "1" value, then the respective OR gates $114_0$ to $114_m$ are set to a logic "1" even if the respective bit line data $D_0$ to $D_M$ and the key data tag bits $K_0$ to $K_M$ do not match. If all of the ORgates $114_0$ to $114_M$ have a logic "1" output, then the AND gate 116 has a logic "1" output MATCH N. A logic "1" output indicates a match.

If the bit line data $D_0$ to $D_M$ and the key data tag bits Io to $K_M$ do not match, the outputs of the exclusive NOR gates $112_0$ to $112_M$ are set to logic "0." This logic "0" output is sent to the OR gates $114_0$ to $114_M$, causing the OR gates $114_0$ to $114_M$ to have a logic "0" output unless some of the values of the mask data bits $M_0$ to $M_M$ are set to logic "1." If any of the OR gates $114_0$ to $114_M$ have a logic "0" output, then the AND gate 116 has a logic "0" output MATCH N. A logic "0" output indicates no match.

Thus, matches can be indicated by setting a match signal line to one logic value and mismatches can be indicated by setting a match signal line to another different logic value. Referring again to FIG. 1, for example, if the first word in the activated row matches the key data tag, then the compare logic 18 will set "match line 0" to a logic "1" value. Of course, the compare logic could use a logic "0" value for matches and a logic "1" value for mismatches if so desired. The match decoder 20 inputs all of the match signal lines, determines if there has been a match and if there has been a match, initiates the retrieval of the associated information. As noted above, the associated information could be stored in the memory array 12 or it could be stored in a separate memory device.

Figure 3:
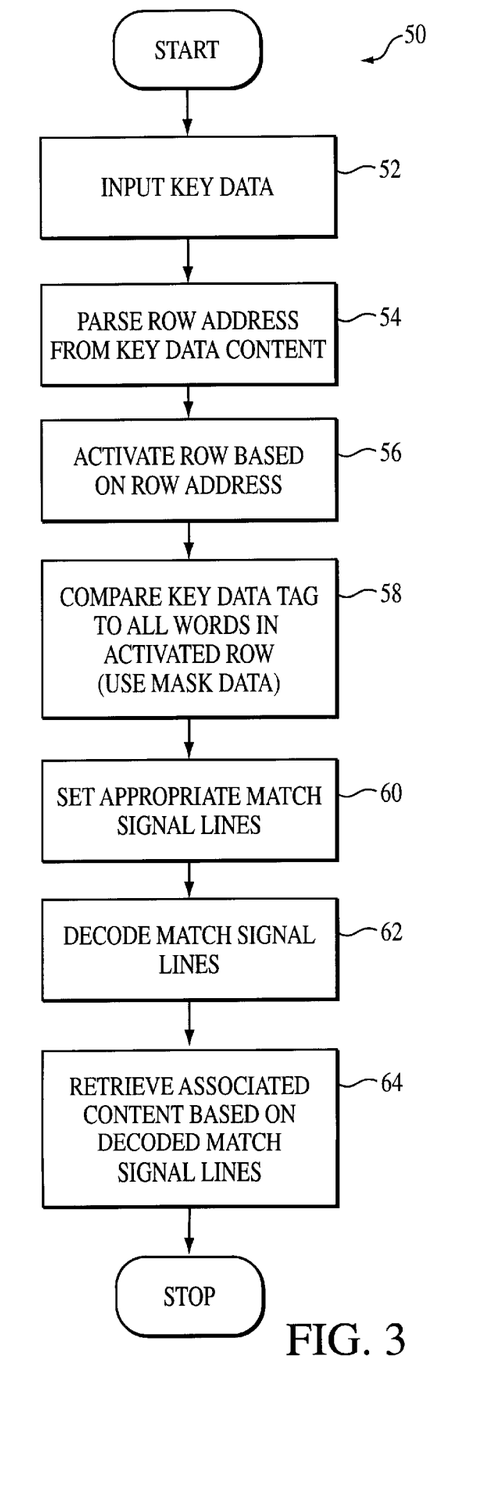
FIG. 3 illustrates an exemplary method of searching for a desired content in a CAM device constructed in accordance with the present invention.

FIG. 3 illustrates an exemplary method 50 of searching for a desired content in a CAM device constructed in accordance with the present invention. The method begins with the input of the key data corresponding to the desired content to be located within the CAM (step 52). Once input, the key data is parsed. Into a row portion and a tag portion (step 54). At step 56 the row decoder receives the row address and activates the appropriate row in the memory array. At the same time, the tag portion is sent to the compare logic.

At step 58 the compare logic compares the key data tag to all of the words in the activated row (that have been sensed by the sense amplifier circuitry). Any mask data that is provided is used in the comparison. At step 60 the compare logic sets the match signal lines to either a match or mismatch logic value based on the comparison performed in step 58. The match decoder inputs and decodes the match signal times (step 62). The information associated with the desired content is then retrieved based on the decoded match signal lines (step 64).

Accordingly, the present invention eliminates the need to sequentially access each row in the memory array 12, since portions of the content are being used to access a specific row in the array 12. Moreover, since the key data tag is reduced by the number of bits being used as the row address, the amount of information being compared by the compare logic is reduced. AlU of these factors contribute to a much speedier search than prior art CAM devices. In addition, the present invention uses standard DRAM cells in the CAM device, which reduces the number of transistors in the CAM device.

Figure 5:
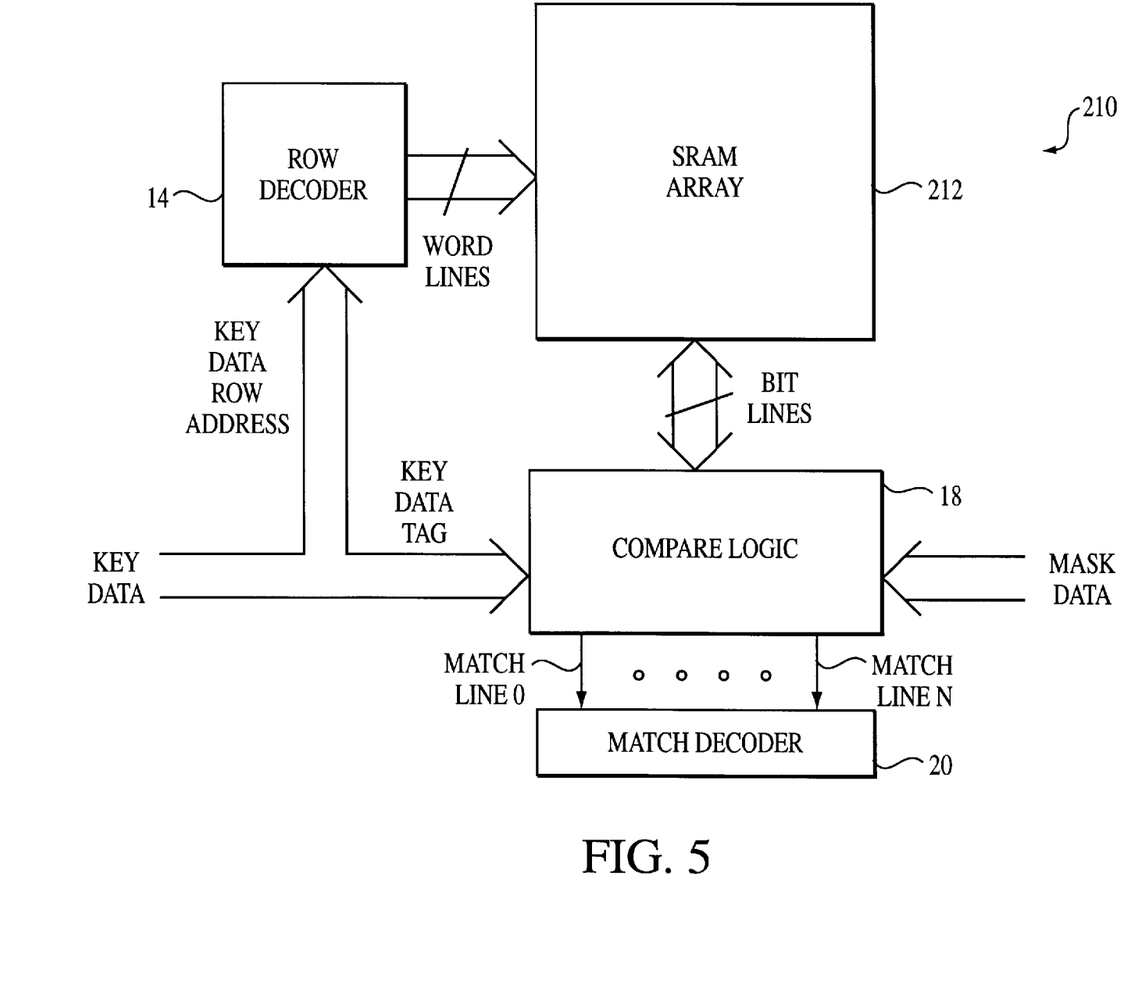
FIG. 5 is a block diagram illustrating another CAM device constructed in accordance with another embodiment of the present invention.

The CAM device of the present invention can also be implemented using SRAM memory cells. FIG. 5 is a block diagram illustrating a CAM device 210 implemented using a memory 212 comprising SRAM memory cells. The device 210 also includes a row decoder 14, compare logic 18 and a match decoder 20. The row decoder 14, compare logic 18 and match decoder 20 are substantially the same as the components used in the device 10 illustrated in FIG. 1. Since the CAM device 210 is using SRAM cells, a sense amplifier is not required. Inputs to the CAM device 210 include key data and mask data. Similar to the device 10 illustrated in FIG. 1, the device 210 utilizes a portion of the key data as a row address to speed up the search for the desired tag. The tag portion of the key data will be compared to the contents of the memory array 212 to complete the search for the desired content.

The memory array 212 is comprised of an array of SRAM cells. The memory cells of the array 212 are organized into a plurality of rows, with each row having memory cells grouped into a plurality of words. It is desirable for words to be 32-bit words, although the words can be 8-bit, 16-bit, 64-bit, or any other size suitable for the intended application. Word lines used to activate rows within the memory array 212 connect the array 212 to the row decoder 14. The bit lines from the memory cells are connected to the compare logic 18.

As described above with respect to FIGS. 1 to 4, the compare logic 18 compares the tag portion of the key data to information retrieved from an addressed row of the memory array 212. The compare logic 18 will also utilize the mask data to mask out "don't cares" bits for a particular comparison. It should be noted that the compare logic 18 is only required for the portions of the memory array 12 that are to be used as a CAM. That is, because the memory array 212 is comprised of conventional SRAM memory cells, portions of the array 212 may be used as SRAM and other portions may be used as CAM (if desired). The SRAM portions could be used to store the information associated with the content stored in the CAM cells thus, alleviating the need for an additional memory array to store the associated information (e.g., routing information).

Referring again to FIG. 5, the row address portion of the key data is sent to the row decoder 14 while the tag portion is sent to the compare logic 18. The entire key data content can be sent to the row decoder 14 and the compare 18 if desired. In that case, the row decoder 14 and compare logic 18 would require a mechanism for masking out the unwanted portions of the key data. Once the row decoder 14 receives the row address, a word line corresponding to the row address is activated. The activation of the word line couples all of the memory cells corresponding to that row to respective bit lines, which are then input into the compare logic 18.

The compare circuitry 18 inputs the information from the memory array 212 and compares the information to the tag portion of the key data. Any information that is considered a don't care is masked out by the compare logic 18 (via the mask data). All of the words in an activated row are sent to the compare logic 18 at the same time thus, the compare logic 18 can compare the key data tag to each word at the same time also. The compare logic outputs match signal lines to the match decoder 20. FIG. 5 illustrates a plurality of match signal lines. It is desired that there be a match signal line for every word in a row. Thus, if it is possible for a row to contain sixteen words, then the compare logic 18 will execute sixteen simultaneous comparisons and output sixteen match signal lines to indicate the results of the comparisons. The compare logic 18 operates as described with reference to FIG. 4.

Thus, matches can be indicated by setting a match signal line to one logic value and mismatches can be indicated by setting a match signal line to another different logic value. If the first word in the activated row matches the key data tag, then the compare logic 18 will set "match line 0" to a logic "1" value. Of course, the compare logic could use a logic "0" value for matches and a logic "1" value for mismatches if so desired. The match decoder 20 inputs all of the match signal lines, determines if there has been a match and if there has been a match, initiates the retrieval of the associated information. As noted above, the associated information could be stored in the memory array 212 or it could be stored in a separate memory device.

The CAM device 212 eliminates the need to sequentially access each row in the memory array 212, since portions of the content are being used to access a specific row in the array 212. Moreover, since the key data tag is reduced by the number of bits being used as the row address, the amount of information being compared by the compare logic is reduced. AU of these factors contribute to a much speedier search than prior art CAM devices. If, for example, the example CAM devices of the present invention are used in network router, then the key data is most likely going to be a 32-bit IP address. If, for example, eight MSBs are used for the row address, then there will be twenty-four bits in the tag. There can be a large number of potential 24-bit words that can be stored on a given row. Thus, there is the possibility that one row in the memory array could require much more CAM space than other rows. The memory would be very sparsely occupied, rendering the method of the present invention less efficient than desired.

Therefore, it is desirable that the present invention utilize virtual rows, which have the ability to be much larger than the physical rows of the memory array. Virtual rows can be accomplished by mapping a number of unassigned physical rows (of separate memory arrays) to a particular virtual row address. Thus, additional memory that may be configured to any row address is required. The additional memory could be configured to a particular virtual row by any technique, such as those commonly used to implement redundant memory. The configuration could involve the use of volatile storage elements, such as SRAM, or non-volatile elements such as flash electrically programmable read only memory (EPROM) or anti-fuses to convert the physical rows into virtual row address.

Figure 6:
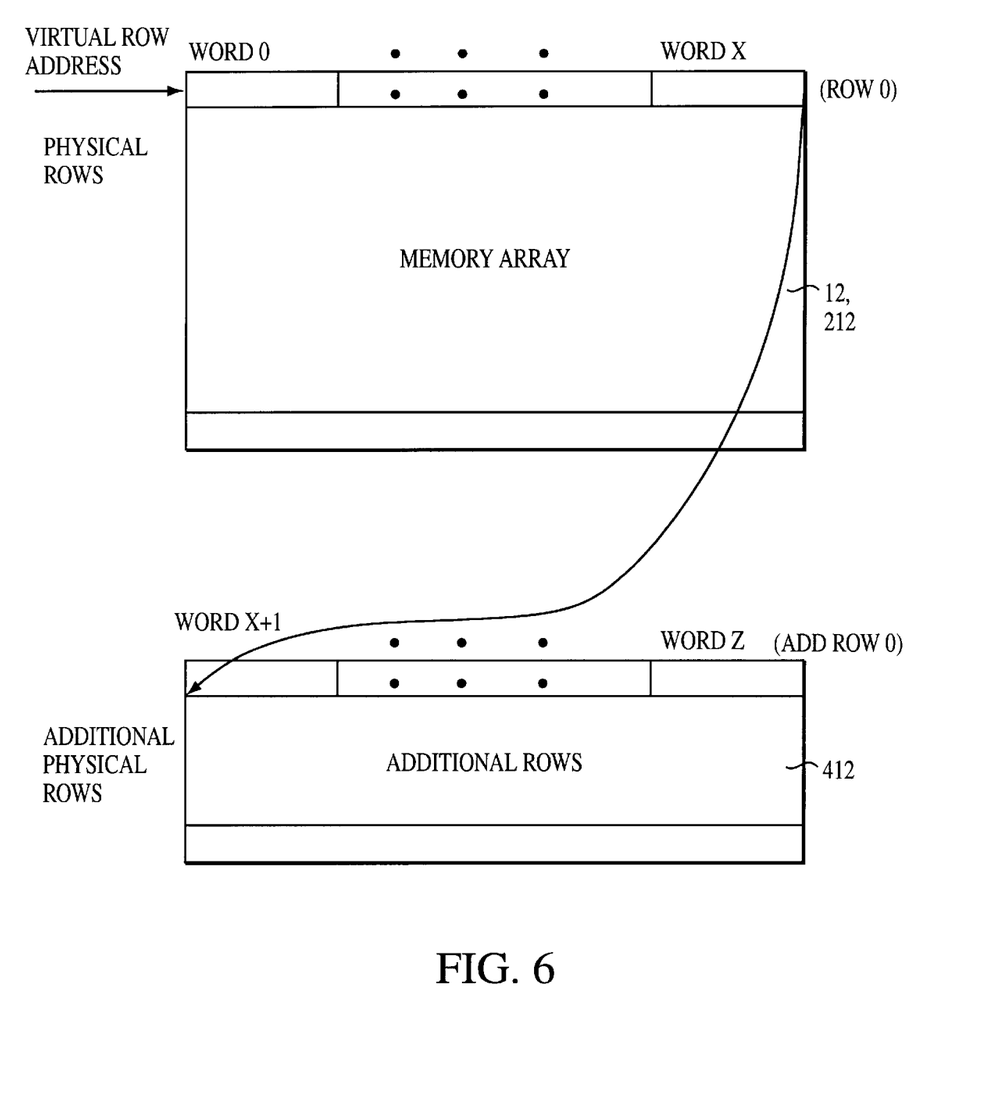
FIG. 6 illustrates an exemplary mapping of virtual rows utilized by an embodiment of the present invention.

FIG. 6 illustrates an exemplary mapping of virtual rows to physical rows as used in the present invention. The memory array 12 (or 212) has physical rows, each row has a plurality of words WORD 0 to WORD X. It presumed that physical row ROW 1 needs additional words. Thus, a virtual row address is required. An additional physical row ADD ROW 0 from an array of additional rows 412 is then configured to be part of the virtual row that includes ROW 0. Thus, the virtual row now contains the additional words WORD X+1 to WORD Z from the array of additional rows 412. The mapping can be done by any technique and the invention is not to be limited to a particular mapping technique.

Figure 7:
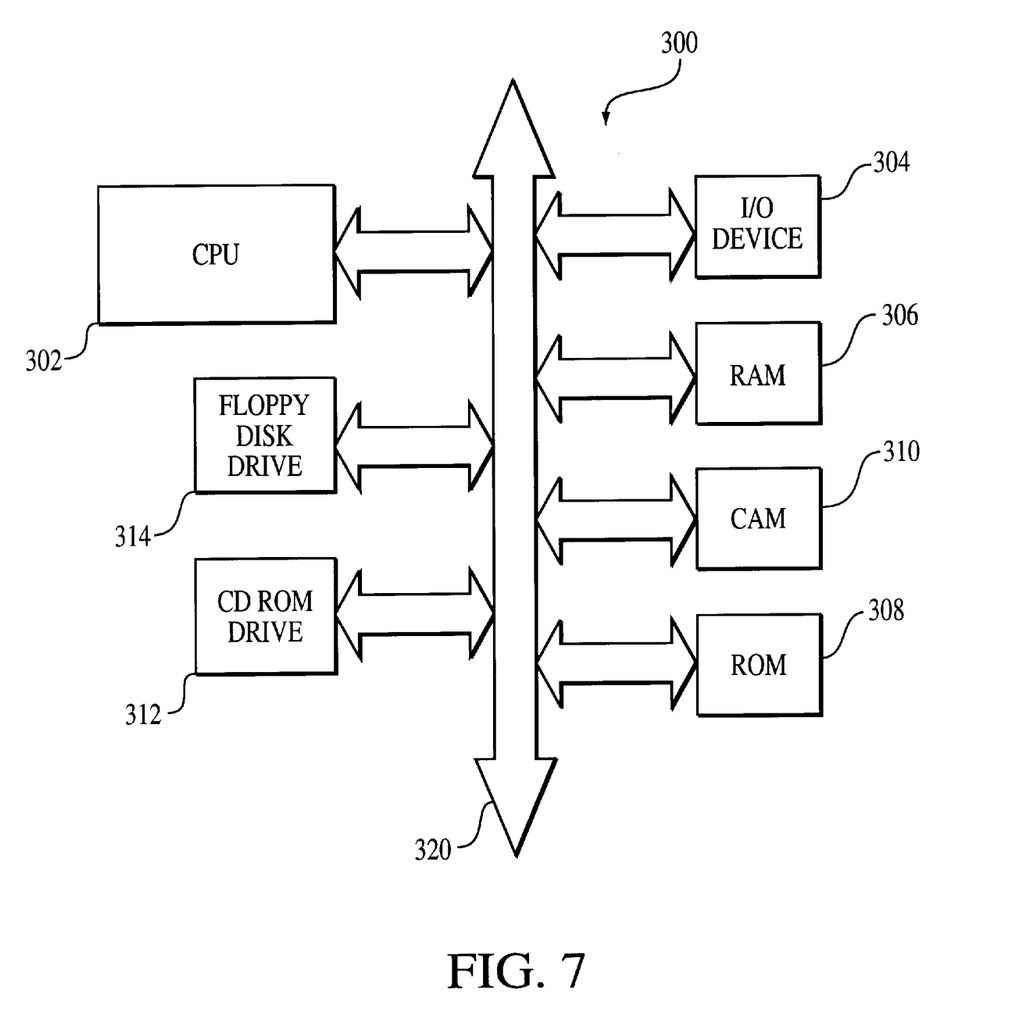
FIG. 7 illustrates a block diagram of a processor-based system utilizing a CAM device constructed in accordance with the present invention.

FIG. 7 illustrates a block diagram of a processor-based system 300 utilizing a CAM device 310 constructed in accordance with the present invention. That is, the CAM device 310 may be the CAM device 10 illustrated in FIG. 1 or the device 210 illustrated in FIG. 5 and operates as described above with respect to FIGS. 1 to 6. The processor-based system 300 may be a computer system, a network switch, network router, process control system or any other system requiring a CAM device. The system 300 includes a central processing unit (CPU) 302, e.g., a microprocessor, that communicates with the CAM 310 over a bus 320. It must be noted that the bus 320 may be a series of buses and bridges commonly used in a processor-based system, but for convenience purposes only, the bus 320 has been illustrated as a single bus. An input/output (I/O) device 304 may also be connected to the bus 320, but is not necessary to practice the invention. The processor-based system 300 also includes a RAM 306, read-only memory (ROM) 308 and may include peripheral devices such as a floppy disk drive 314 and a compact disk (CD) ROM drive 312 that also communicates with the CPU 302 over the bus 320 as is well known in the art.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A method of operating a content addressable memory device, said method comprising the steps of:
   accessing memory locations within the memory device using a first portion of a desired content as an address for the memory device; and
   comparing stored content of the accessed memory locations with a second portion of the desired content.

2. The method of claim 1 further comprising the step of providing an indicator if the stored content of any of the accessed memory locations match the second portion of the desired content.

3. The method of claim 1 further comprising the step of providing an indicator if none of the stored content of any of the accessed memory locations match the second portion of the desired content.

4. The method of claim 1, wherein the memory device is organized as an array having a plurality of rows and the first portion of the desired content is used as a row address.

5. The method of claim 4, wherein said accessing step comprises activating a row within the memory device using the row address associated with the first portion of the desired content.

6. The method of claim 5, wherein each row in the memory device includes a plurality of words, and said method performs said accessing and comparing steps on all of the words of the activated row simultaneously.

7. The method of claim 4, wherein the row address corresponds to a physical row within the memory device.

8. The method of claim 4, wherein the row address corresponds to a virtual row within the memory device.

9. The method of claim 1 further comprising the step of retrieving information associated with the desired content if the stored content of any of the accessed memory locations match the second portion of the desired content.

10. A method of operating a content addressable memory device, said method comprising the steps of:
    accessing memory locations within the memory device using an address computed from a desired content to address the memory device; and
    comparing stored content of the accessed memory locations with a remainder of the desired content.

11. The method of claim 10 further comprising the step of providing an indicator if the stored content of any of the accessed memory locations match the remainder of the desired content.

12. The method of claim 10 further comprising the step of providing an indicator if none of the stored content of any of the accessed memory locations match the remainder of the desired content.

13. The method of claim 10, wherein the memory device is organized as an array having a plurality of rows and the address computed from the desired content is used as a row address.

14. The method of claim 13, wherein said accessing step comprises activating a row within the memory device using the row address computed from the desired content.

15. The method of claim 14, wherein each row in the memory device includes a plurality of words, and said method performs said accessing and comparing steps on all of the words of the activated row simultaneously.

16. The method of claim 10 further comprising the step of retrieving information associated with the desired content if the stored content of any of the accessed memory locations match the remainder of the desired content.

17. A content addressable memory device comprising:
    a memory array having memory cells organized into a plurality of rows;

a row decoder coupled to said memory array, said row decoder using a first portion of a desired content as a row address for said memory array and activating a row of memory cells within said memory array based on the row address; and a compare logic circuit coupled to said memory array, said compare logic circuit comparing stored content of said activated row of memory cells with a second portion of the desired content.

18. The memory device of claim 17, wherein said compare logic circuit provides an indicator if the stored content of said activated row of memory cells match the second portion of the desired content.

19. The memory device of claim 17, wherein said compare logic circuit provides an indicator if none of the stored content of said activated row of memory cells match the second portion of the desired content.

20. The memory device of claim 17, wherein each row in said memory array includes a plurality of words, said compare logic compares the stored content of all of the words of said activated row simultaneously.

21. The memory device of claim 17, wherein the row address corresponds to a physical row within said memory array.

22. The memory device of claim 17, wherein the row address corresponds to a virtual row within said memory array.

23. The memory device of claim 17 further comprising a match decoder coupled to said compare logic circuit, said match decoder receiving match information signals from said compare logic circuit and decoding the signals to determine a match location of stored content of said activated row of memory cells that matches the second portion of the desired content.

24. The memory device of claim 23, wherein said match decoder uses the match location to retrieve information associated with the desired content.

25. The memory device of claim 17, wherein said memory array comprises dynamic random access memory cells.

26. The memory device of claim 25 further comprising a sense amplifier circuit coupled between said memory array and said compare logic circuit, said sense amplifier circuit sensing and amplifying the stored content of said activated row of memory cells and outputting the amplified stored content to the compare logic circuit.

27. The memory device of claim 17, wherein said memory array comprises static random access memory cells.

28. A content addressable memory device comprising:

a memory array having memory cells organized into a plurality of rows;

a row decoder coupled to said memory array, said row decoder using a row address computed from a desired content to activate a row of memory cells within said memory array based on the row address; and a compare logic circuit coupled to said memory array, said compare logic circuit comparing stored content of said activated row of memory cells with a remainder of the desired content.

29. A processor based system comprising:

a processor; and a memory device coupled to said processor, said memory device comprising:

a memory array having memory cells organized into a plurality of rows;

a row decoder coupled to said memory array, said row decoder using a first portion of a desired content as a row address for said memory device and activating a row of memory cells within said memory array based on the row address; and a compare logic circuit coupled to said memory array, said compare logic circuit comparing stored content of said activated row of memory cells with a second portion of the desired content.

30. The system memory of claim 29, wherein said compare logic circuit provides an indicator if the stored content of said activated row of memory cells match the second portion of the desired content.

31. The system of claim 29, wherein said compare logic circuit provides an indicator if none of the stored content of said activated row of memory cells match the second portion of the desired content.

32. The system of claim 29, wherein each row in said memory array includes a plurality of words, said compare logic compares the stored content of all of the words of said activated row simultaneously.

33. The system of claim 29, wherein the row address corresponds to a physical row within said memory array.

34. The system of claim 29, wherein the row address corresponds to a virtual row within said memory array.

35. The system of claim 29, wherein said memory device further comprises a match decoder coupled to said compare logic circuit, said match decoder receiving match information signals from said compare logic circuit and decoding the signals to determine a match location of stored content of said activated row of memory cells that matches the second portion of the desired content.

36. The system of claim 35, wherein said match decoder uses the match location to retrieve information associated with the desired content.

37. The system of claim 29, wherein said memory array comprises dynamic random access memory cells.

38. The system of claim 37, wherein said memory device further comprises a sense amplifier circuit coupled between said memory array and said compare logic circuit, said sense amplifier circuit sensing and amplifying the stored content of said activated row of memory cells and outputting the amplified stored content to the compare logic circuit.

39. The system of claim 29, wherein said memory array comprises static random access memory cells.

40. The system of claim 29, wherein said system is a network router and the desired content is an Internet Protocol address.

41. The system of claim 29, wherein said system is a network switch and the desired content is an Internet Protocol address.

* * * * *

UNITED STATES PATENT AND TRADEMARK OFFICE
CERTIFICATE OF CORRECTION

PATENT NO. : 6,240,003 B1
DATED : May 29, 2001
INVENTOR(S) : David J. McElroy

It is certified that error appears in the above-identified patent and that said Letters Patent is hereby corrected as shown below:

<u>Column 4,</u>
Line 69, "I0" should read -- $K_0$ --.

<u>Column 5,</u>
Line 27, "parsed. Into" should read -- parsed into --.
Line 48, "AlU" should read -- All --.

Signed and Sealed this

Fifteenth Day of January, 2002

JAMES E. ROGAN
*Director of the United States Patent and Trademark Office*

*Attesting Officer*